(12) United States Patent
Hauer et al.

(10) Patent No.: US 8,677,615 B2
(45) Date of Patent: Mar. 25, 2014

(54) METHOD FOR EMBEDDING ELECTRICAL COMPONENTS

(75) Inventors: Marc Hauer, Zurich (CH); Markus Riester, Seiersberg (AT)

(73) Assignee: DYCONEX AG, Bassersdorf (CH)

( * ) Notice: Subject to any disclaimer, the term of this patent is extended or adjusted under 35 U.S.C. 154(b) by 0 days.

(21) Appl. No.: 13/178,657

(22) Filed: Jul. 8, 2011

(65) Prior Publication Data

US 2012/0042514 A1 Feb. 23, 2012

(30) Foreign Application Priority Data

Aug. 18, 2010 (DE) .................... 10 2010 037 054

(51) Int. Cl.
*H05K 3/30* (2006.01)
(52) U.S. Cl.
USPC ............. 29/841; 29/825; 29/832; 29/840; 174/259; 228/180.22
(58) Field of Classification Search
USPC ............. 29/825, 832, 840, 841; 228/180.22
See application file for complete search history.

(56) References Cited

U.S. PATENT DOCUMENTS

| | | | |
|---|---|---|---|
| 7,845,074 B2 * | 12/2010 | Motomura et al. | 29/856 |
| 2003/0087538 A1 | 5/2003 | Ueno | |
| 2007/0200232 A1 | 8/2007 | Suzuki et al. | |
| 2008/0104832 A1 * | 5/2008 | Shintate | 29/846 |
| 2008/0123318 A1 | 5/2008 | Lam | |
| 2008/0315375 A1 | 12/2008 | Eichelberger et al. | |
| 2009/0097214 A1 * | 4/2009 | Lee et al. | 361/752 |
| 2009/0260229 A1 | 10/2009 | Motomura et al. | |

FOREIGN PATENT DOCUMENTS

| | | |
|---|---|---|
| DE | 10 2007 024 189 | 11/2008 |
| JP | 2007-088009 | * 4/2007 |

OTHER PUBLICATIONS

European Search Report and Notes to the European Search Report on European Patent Application No. EP 11 17 2305, dated Sep. 27, 2011 (8 pages).

* cited by examiner

*Primary Examiner* — Carl Arbes
(74) *Attorney, Agent, or Firm* — Buchanan Ingersoll & Rooney PC

(57) ABSTRACT

A method for embedding at least one component into a dielectric layer. obtain a good result, it is provided that the method includes the following steps: a) Position and affix the at least one component on a carrier; b) Cast a liquid dielectric around the at least one component, thereby enclosing the at least one component completely; c) Harden the liquid dielectric to form a solid dielectric layer; and d) Apply, in particular by lamination thereon, another layer, in particular an electrically conductive layer. The use of a dielectric layer formed entirely of liquid dielectric, wherein the liquid dielectric is not converted into a solid state until the dielectric is processed.

19 Claims, 5 Drawing Sheets

METHOD FOR EMBEDDING ELECTRICAL COMPONENTS

CROSS-REFERENCE TO RELATED APPLICATIONS

This application claims the priority of German Patent Application No. DE 10 2010 037 054.1, filed on Aug. 18, 2010 in the German Patent Office, the disclosure of which is incorporated herein in its entirety by reference.

TECHNICAL FIELD

The invention relates to a method for embedding electrical components in a printed circuit board according to the preambles of the independent claim(s).

BACKGROUND

It is known from the prior art that the dielectric materials for a printed circuit board are present as structured or unstructured foil. In the first case (structured), the material flows around the components mounted on the substrate during heating and pressing and encloses them. In the second case (unstructured), the foils are placed via recesses therein over the components. If very thin components are involved, the components can be pressed directly into said foil.

If thicker components are involved, the dielectric must be pre-routed. Furthermore, in order to enclose the components entirely, it is usually necessary to work with a plurality of dielectric foils disposed one above the other.

It is disadvantageous that the material flows into the recess during pressing, thereby surrounding the components entirely. In the cases in which the volume of the cavity is so great that the quantity of material is insufficient to fill the cavity, additional liquid material is poured into the cavity, and so less material from the foil material is required.

In another known method, semiconductor processes (for example "spin coating") are used to apply liquid dielectrics in a planar manner. Said methods are also used for embedding one or more chips. Only relatively thin thicknesses of less than 20 µm are possible, however. Greater thicknesses, which can be attained by, for example, screen printing or knife-coating, are not possible.

U.S. Publication No. 2008/0123318 describes a method for assembling a printed circuit board. In that case, a substrate which comprises recesses is positioned on a vacuum plate. After components have been inserted into the recesses, the open cavities of the recesses are filled with an adhesive in order to affix the components. Subsequent thereto, after the vacuum plate has been removed, a metal film is applied to a front side and to a back side of the substrate.

Proceeding from the prior art, a problem to be solved is therefore that of dielectrically embedding the components without allowing unnecessary forces to act thereon, and without the need to pre-route a foil. Furthermore, the method should enable components of different sizes and thicknesses to be enclosed simultaneously.

The present invention is directed at overcoming one or more of the above-identified problems.

SUMMARY

The problems are solved, according to the invention, by a method having the features of the independent claim(s). In addition, the problems are solved by the use of a dielectric layer formed entirely of liquid dielectric, wherein the liquid dielectric is not converted into a solid state until the dielectric is processed.

Favorable embodiments and advantages of the invention will become apparent from the further dependent claims, the drawings, and the description.

The invention is directed to a method for embedding at least one component into a dielectric layer.

It is provided that the method comprises the following steps: a) Position and affix the at least one component on a carrier; b) Cast a liquid dielectric around the at least one component, thereby enclosing the at least one component completely; c) Harden the liquid dielectric to form a solid dielectric layer; and d) Apply, in particular by lamination thereon, another layer, in particular an electrically conductive layer.

By way of the method according to the invention, components can be advantageously embedded into a dielectric layer, thereby making it possible to produce a compact printed circuit board. By using this method, it is possible to eliminate the use of pre-routed foils. Furthermore, a prestructuring of foils is omitted, thereby reducing labor and costs. Furthermore still, the embedding can be tailored to a specific component volume, thereby enabling prefabricated foils of different thicknesses to be eliminated entirely. The method is therefore also independent of an availability of dielectrics, in particular foils, of certain thicknesses. In addition, components of different sizes and thicknesses can be enclosed simultaneously using a reliable process. In said embedding process, the components are cast in the carrier, thereby resulting in a smaller volume. The method therefore makes it possible to easily miniaturize electrical structures. In addition, a production format can be larger by one to two orders of magnitude than is the case using a packaging process according to the prior art.

A further layer can be applied to the dielectric by lamination thereon in particular. Lamination involves applying a film-like layer to a surface using an adhesive. Other coating methods are feasible, of course, such as, for example, screen printing, galvanizing, or vacuum coating methods such as vapor deposition or coating using cathode sputtering. The additional layer can then be structured, for instance, e.g., using typical etching processes, such that tracks are formed for contacting the embedded components. The contacts are exposed for that purpose, e.g., using wet chemical or ion-supported etching processes.

Advantageously, relatively small structures, such as, for example, contact tracks for connecting components, can also be created, wherein the number of connections that can be attained is dependent only on the quality of the photo processes and the coating.

Embedding takes place during the process of producing the printed circuit board and therefore makes it possible to manufacture "embedded cores" ("EDC"), i.e., printed circuit board cores having embedded components, or generally EDC in every structure layer of a sequentially built-up printed circuit board. In this case "liquid" is understood to mean that an aggregate state of an applicable substance is not solid, and/or that the substance is fluid. A viscous substance is also implied. The substance is liquid, in particular, in the process of casting around. In this case, "to harden" means that the aggregate state of the substance transitions from a liquid to a solid. Hardening takes place using a chemical or physical pulse, such as, for example, the addition of a radical starter, a change in the pH value, time, temperature, radiation (e.g., UV, VIS, IR, x-ray, radioactive radiation), and, in particular, by a temperature change, particularly preferably a temperature increase. In the process of casting around, the dielectric is applied over the complete production format or production panel. Method steps a) to d) can be followed by additional steps, such as, for example, step e) to electrically connect the components using known printed circuit board processes.

Advantageously, the dielectric is formed with a minimum thickness of approximately 10 μm (in the hardened state), a maximum thickness of approximately 1000 μm, and a preferred thickness of approximately 30-250 μm. In this context, a "thickness" is understood to mean an extension of the dielectric perpendicularly to a plane of the carrier. The plane is the surface of the carrier to which the components are affixed. By way of said thickness, components mounted on the carrier can be enclosed completely, thereby protecting them from harmful environmental influences. Furthermore, they are embedded such that no forces can act thereon.

It is furthermore provided that the dielectric is formed of a thermoplastic material and/or a thermosetting plastic. Any thermoplastic material and/or thermosetting plastic considered usable by a person skilled in the art may be used. However, the dielectric is preferably formed of an element from the group comprising: polyimide, epoxy resin, polyester resin, polyurethane, and amino resin, and particularly preferably of a polyimide, such as "Sunflex" from Sun Chemical. Basically, the dielectric could also be made of another material for the production of printed circuit boards. By way of the material that is used, environmental and process influences known from printed circuit board manufacture can be easily overcome.

In a further embodiment of the invention, the carrier is formed of at least one electrically conductive layer. Particularly advantageously, the carrier is formed of a metal foil, in particular a thin metal foil, or it can comprise at least one metal foil. The metal foil is affixed temporarily on a thick metal sheet. After the further electrically conductive layer is laminated thereon and the dielectric has been applied, the carrier can be separated from the thin metal foil. By designing the carrier as an electrically conductive layer, the carrier can perform two functions in a component-saving manner. The carrier ca be unstructured or not structured at the point in time when the components are embedded, thereby simplifying the process.

Alternatively, the carrier can be an integral component of a printed circuit board structure formed by a further layer of the printed circuit board. Method steps a) to d) and a further method step e) to electrically connect the components using known printed circuit board processes can be repeated depending on the number of layers required. Due to the design of the carrier as a further layer of the printed circuit board, a sequentially built-up printed circuit board can be manufactured in a structurally simple manner using fewer process steps, in a component-saving and cost-saving manner, than is the case with a production process having an additional carrier.

Furthermore, it is advantageous for the additional layer, in particular a further electrically conductive layer, to be formed of an element of the group comprising a metal foil, a thermoplastic polymer foil, or a metal-clad thermosetting plastic. However, any other conductive layer considered reasonable by a person skilled in the art would be feasible in principle. The metal foil is, in particular, a copper foil. Copper can be applied either on the entire production format using a subtractive process or in prestructured cavities in a sacrificial layer, using galvanic processes, for instance, as are known from the prior art. The subtractive process is a method that is widely used to manufacture a structured conductive pattern and involves the partial removal of parts of a conductive foil or the selective etching away of the undesired parts of a conductive cladding. The copper foil can be structured after application. Using the design according to the invention and, in particular, the copper foil, the embedded components can be electrically contacted in a structurally simple manner. In addition, a volume required for such contacting is clearly less than a volume required in techniques according to the prior art, such as wire bonding, soldering, or adhesive bonding.

In addition, at least one further dielectric adhesive layer ply can be provided on the first dielectric layer. This additional layer is preferably located on the side facing the electrically conductive layer. It is used to support the lamination of the conductive layer thereon. For example, preaffixation can take place by way of the adhesive effect before the lamination step.

Casting around can be accomplished using various coating and printing processes considered usable by a person skilled in the art. It is provided that the casting around be carried out using a method from the group comprising screen printing, knife-coating, "curtain coating" (application of a spray mist onto a surface), laminating processes, flexography, or engraving. Screen printing or knife-coating are preferred in this case. Using said methods, a technique can be used that is well established and yields reliable results.

Advantageously, a component is used that comprises at least one electrical or thermal contact on at least one side thereof. The component has a plurality of electrical or thermal contacts on at least one side, which is practical. The at least one component is placed on the carrier with at least one electrical or thermal contact oriented upward, and/or downward, and/or on the side, thereby advantageously resulting in a broad spectrum of use. Furthermore, it is provided that components having an electrical contact on the bottom and/or on the top and/or on the side and/or comprising a plurality of electrical contacts on the bottom and/or on the top and/or on the side are provided in combinations in one component layer. It is therefore possible to place components of different types on a carrier, i.e., with electrical or thermal contacts on the top, electrical or thermal contacts on the bottom, electrical or thermal contacts on the top and bottom, and/or electrical or thermal contacts on the side. Said embodiment makes it possible to use various components in a variable manner independently of the individual designs thereof.

According to a preferred development, the method comprises an initial process step before step a), in which an adhesive is applied to the carrier, on which the components are positioned and affixed. Alternatively and/or in addition thereto, in the initial process step, an adhesive can be applied to the components, with which they are bonded to the carrier. The adhesive can be a liquid adhesive or a foil adhesive. Preferably it can be conductive or non-conductive, and/or, particularly preferably, applied to the carrier to the components in an unstructured or structured manner. In general, any other adhesive considered usable by a person skilled in the art would also be feasible.

A functionally consistent design can be attained, advantageously, when the at least one component—which has been embedded according to the invention—is electrically contacted to the conductive layers by way of plated blind holes between the conductive layers or conductive adhesive. A z-axis connection (through the dielectric and the additional layer) is produced by drilling holes, preferably using plasma drilling or laser drilling processes.

It is also provided that the at least one component is formed by an electrical component and/or, in particular, by a component of the group comprising ICs (integrated circuits), IPDs (integrated passive components), ASICs (application-specific integrated circuits), or flat passive components. The components can be part of an assembly (the "stack"), or a discrete component that is installed in a package in this manner, such as, for example, resistors, capacitors, inductors, and the like. It is therefore possible to embed diverse components using the method according to the invention. Furthermore, it is provided that the at least one component is formed of a "thermal component", i.e., components having high heat dissipation. They can be, for example, power amplifiers, the heat of which is dissipated using thermal contacts, such as thermal vias, for example. Thermal vias in the sense of the patent application are through-holes without an electrical function, which are made of copper, for instance, as the heat-conducting material. It is also possible to use components that are operated using electrical fields, such as, for example, RFID chips (radio-frequency identification chips). The components require no structural electrical or thermal connectors.

The invention is furthermore directed to a method for embedding components into a dielectric layer. It is provided that the method comprises the following steps: a) Position and affix the component on a carrier; b) Cast a liquid dielectric around the component, thereby enclosing the component completely, wherein the dielectric has the following values: i. Minimum thickness of approximately 10 µm (in the hardened state); ii. Maximum thickness of approximately 1000 µm; iii. Preferred thickness of approximately 30-250 µm; c) Harden the dielectric to form a solid dielectric layer; and d) Apply, in particular by lamination thereon, another layer, in particular an electrically conductive layer. In a modified embodiment, processes c) and d) can also take place in the same process step. Method steps a) to d) can be followed by additional steps, such as, for example, step e) to electrically connect the components using known printed circuit board processes.

In addition, the invention is directed to a use of a dielectric layer formed entirely of liquid dielectric, wherein the liquid dielectric is not converted into a solid state until the dielectric is processed.

The use of the liquid dielectric and the stated method ensures that any component volume can be enclosed by a dielectric without strong forces occurring during embedding, which can damage the component.

Various other objects, aspects and advantages of the present invention can be obtained from a study of the specification, the drawings, and the appended claims.

DESCRIPTION OF DRAWINGS

The invention is explained in the following in greater detail with reference to embodiments that are depicted in drawings. In the drawings.

Figure 1A:
FIGS. 1A-E show various steps in the manufacture of a printed circuit board core comprising components having contacts that face a carrier ("embedded core—face down")

Elements that are functionally identical or similar-acting are labeled using the same reference numerals in the figures. The figures are schematic depictions of the invention. They do not depict specific parameters of the invention. In addition, the dimensions of the individual elements are not shown true to scale. Furthermore, the figures merely show typical embodiments of the invention and are not intended to limit the invention to the embodiments shown.

Regarding elements in a figure that are not described in detail, reference is made to the corresponding description of the elements in preceding figures to avoid unnecessary repetition.

DETAILED DESCRIPTION

FIGS. 1A-1E show a sequence of steps of a method for embedding at least one component 101 in a dielectric layer 106 to manufacture a printed circuit board core 107. In the present embodiment, four components 101 are embedded. Components 101 are electrical components and can be, for example, ICs, integrated passive components IPDs, ASICs, or flat passive components. Different components 101 are embedded, which is made clear by the depiction of components 101 having different sizes.

Figure 1B:

A carrier 103 is used, as shown in FIG. 1A. Carrier 103 is formed by a first electrically conductive layer 108 in the form of a thin metal foil 109. As shown in FIG. 1B, an adhesive 102, in the form of a conductive and unstructured foil adhesive, is applied to said carrier 103 in an initial process step before step a). The application covers the entire surface 110 or a plane of carrier 103, which is a side of carrier 103 having a large surface area. Surface 110 is not one of the four circumferential edge surfaces 111 of carrier 103. Alternatively, the adhesive can be applied to components 101, thereby bonding same to carrier 103 (not shown).

Figure 1C:
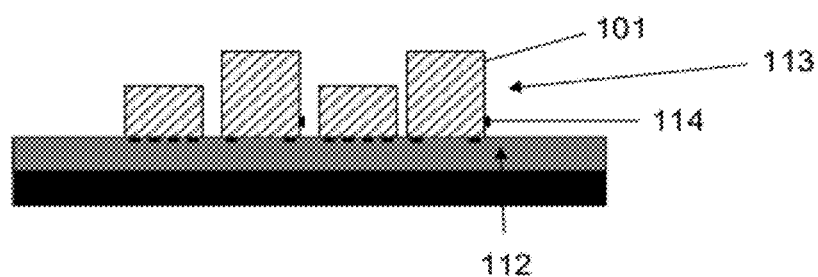

FIG. 1C shows components 101 being positioned and affixed on carrier 103 by positioning and affixing the same on adhesive 102, according to method step a). Each component 101 comprises at least one contact 114 or a plurality of contacts 114 on at least one side 112, 113 or on a side 112 facing surface 110, and, in the case of large components 101, on a side 113, the plane of which extends perpendicularly to surface 110. The one or more contacts 114 are electrical contacts, in particular. Components 101 are therefore placed on carrier 103 with contacts 114 on the bottom and the side. Each of the different components 101 comprises a different number of contacts 114. The component layer contains a mixture of components 101 having contacts 114 on the bottom and the side.

Alternatively, components could have contacts on the top (see FIG. 2), which can likewise be combined in the component layer with components 101 having contacts 114 on the bottom and the side (not shown).

Figure 1D:
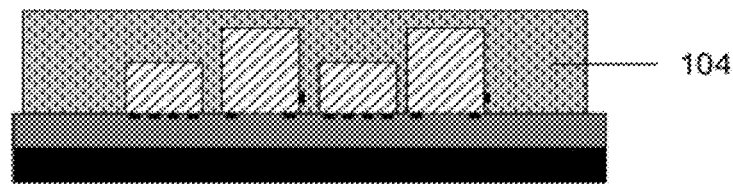

FIG. 1D shows the structure after method steps b) and c). In this case, a liquid dielectric 104 is cast around components 101 using screen printing, thereby completely enclosing components 101. Liquid dielectric 104 is a thermoplastic material or a polyimide. The polyimide Sunflex from Sun Chemical has proved particularly effective for this purpose. After components 101 have been cast around, liquid dielectric 104 is hardened to form a solid dielectric layer 106. This is accomplished generally by the effects of heat. In the hardened state, the dielectric has a thickness 115 of approximately 150 µm perpendicular to surface 110. Furthermore, the dielectric extends parallel to surface 110 substantially along an entire extension 116 of carrier 103.

Figure 1E:
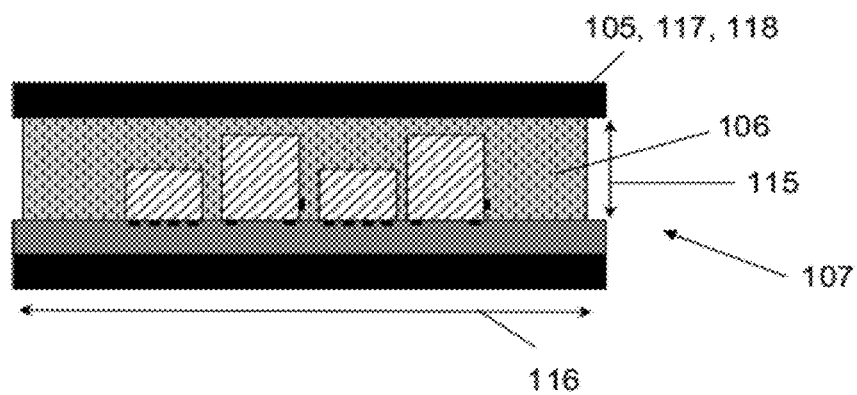
Figure 2A:
FIGS. 2A-E show various steps in the manufacture of an alternative printed circuit board core comprising components having contacts that face away from a carrier ("embedded core—face up")
Figure 2B:
Figure 2C:
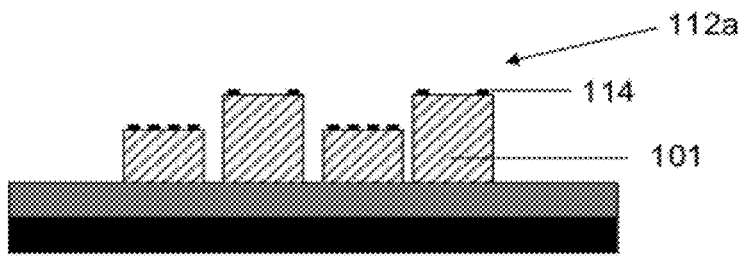
Figure 2D:
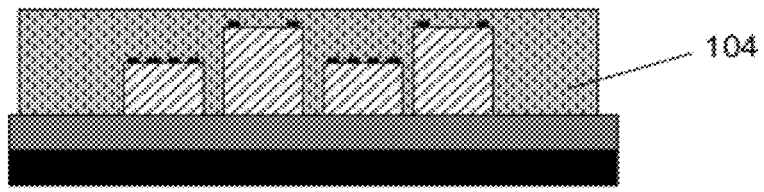
Figure 2E:
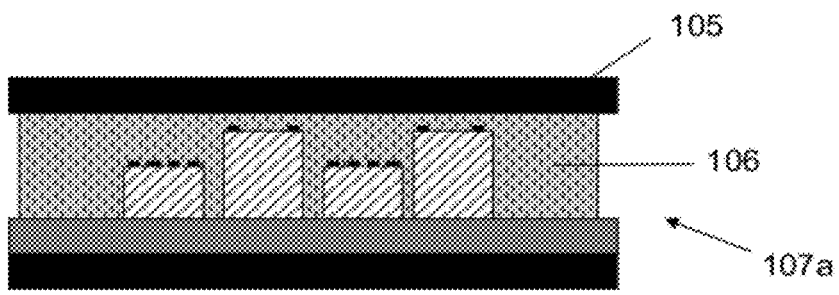

As shown in FIG. 1E, another layer 117 or an electrically conductive layer is applied by lamination after hardening, in accordance with method step d). The further electrically conductive layer 117 can be in the form of a metal foil or a copper foil 118. In a subsequent method step e), components 101 are electrically connected to electrically conductive layers 106, 117 and carrier 103 and copper foil 118 by way of plated blind via-holes (not shown in detail).

The method described shows a use of dielectric layer 106, which is formed entirely of liquid dielectric 104, wherein liquid dielectric 104 is not converted into a solid state until the dielectric is processed.

Figure 3A:
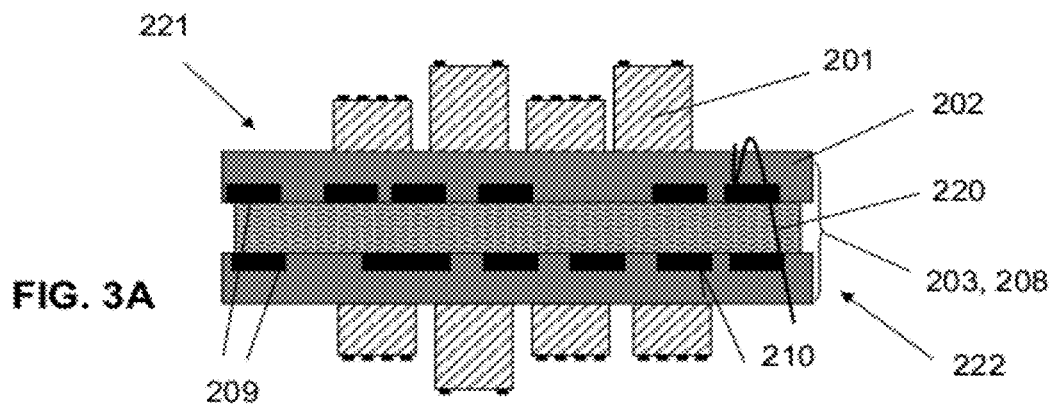
FIGS. 3A-C show various steps in the manufacture of another alternative printed circuit board core comprising components affixed to a front side and a back side (embedded outer layer (roughly))
Figure 3B:
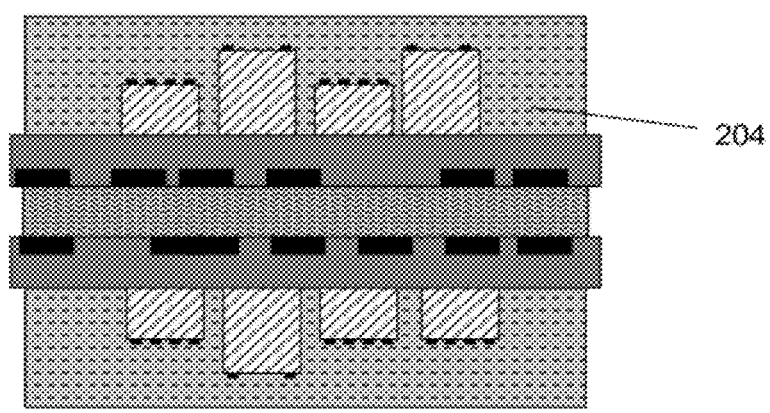

Alternative embodiments of the method are shown in FIGS. 2-4. Components, features, and functions that are essentially the same are labeled using the same reference numerals. However, the letter "a" is appended to individual reference characters used in FIG. 1 in order to differentiate the embodiments depicted in FIGS. 1 and 2. The reference characters used in FIGS. 3 and 4 are increased by 100 for differentiation from the embodiments depicted in FIGS. 1 and 2. The description that follows is limited primarily to the differences from the embodiment shown in FIG. 1. With regard for the components, features, and functions that remain the same, reference is made to the description of the embodiment in FIG. 1.

The embodiment shown in FIG. 2 differs from that shown in FIG. 1 in that a carrier 103*a* of a printed circuit board core 107*a* is formed by a first electrically conductive layer 108*a* in the form of a further layer 119*a* of a printed circuit board. Furthermore, in method step a), components 101 are placed and affixed on carrier 103*a* such that contacts 114 of components 101 are disposed on a side 112*a* that faces away from the surface 110. Components 101 are therefore placed on carrier 103*a* with contacts 114 facing upward (see FIGS. 2C-2E).

FIGS. 3 and 4 show, in a basic and a more detailed depiction, the manufacture of a further alternative printed circuit board core 207. Carrier 203, as a first conductive layer 208, is formed by two grids which are comprised of metal foil 209 and are separated by a separating layer 220. An adhesive 202 is applied to each of the surfaces 210, which face away from the adjacent grid, and separating layer 220 (see FIG. 4A). As shown in FIG. 3A, components 201 are positioned and affixed on carrier 203 and adhesive 202, in accordance with step a). As depicted in FIG. 3A, this can take place before method steps b) and c) on both surfaces 210, i.e., a front side 221 and a back side 222 of carrier 203.

As shown in FIG. 4, this process can also take place in steps. In that particular case, after components 201 are positioned on front side 221 (see FIG. 4B), a liquid dielectric 204 is cast around components 201, thereby enclosing components 201 entirely, and the liquid dielectric 204 hardens to form a solid dielectric layer 206 (see FIG. 4C). Only then are components 203 positioned on back side 222 (see FIG. 4D) and cast around with liquid dielectric 204 which hardens to form a solid dielectric layer 207 (see FIG. 4E).

Figure 3C:
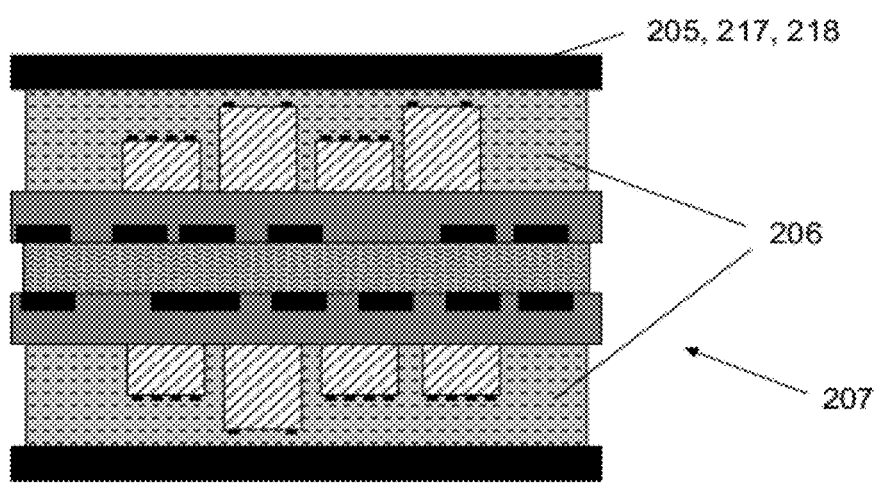
Figure 4A:
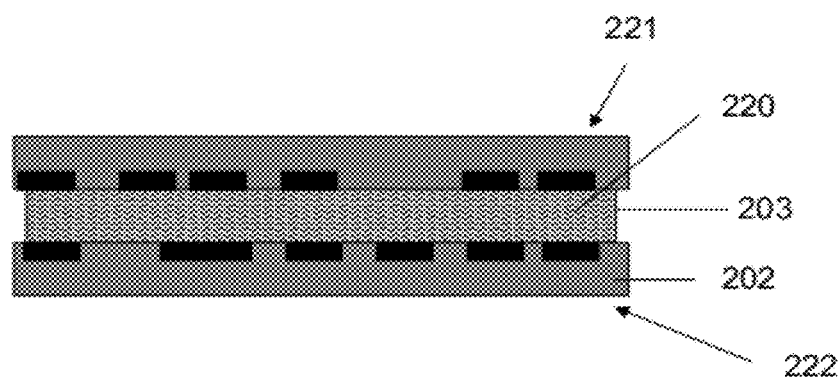
FIGS. 4A-F show various steps in the manufacture of the printed circuit board core depicted in FIG. 3, in a detailed representation (embedded outer layer (fine)).
Figure 4B:
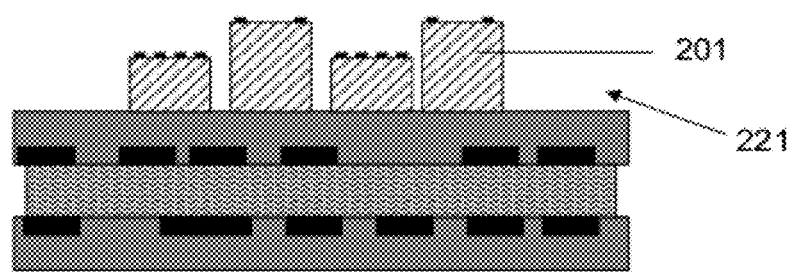
Figure 4C:
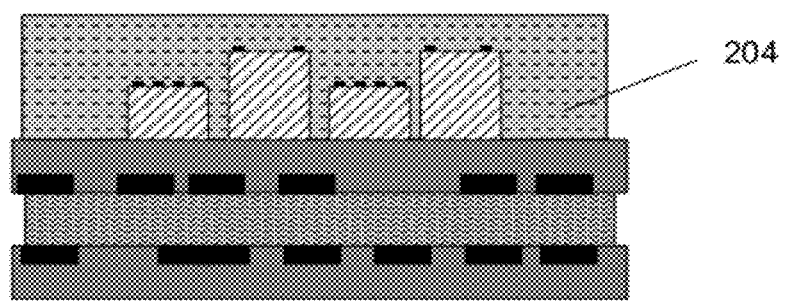
Figure 4D:
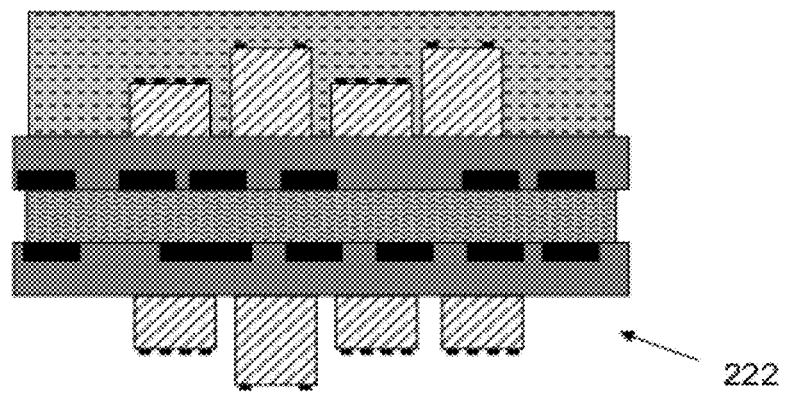
Figure 4E:
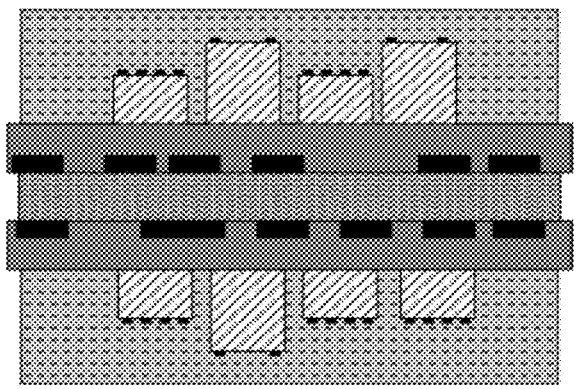
Figure 4F:
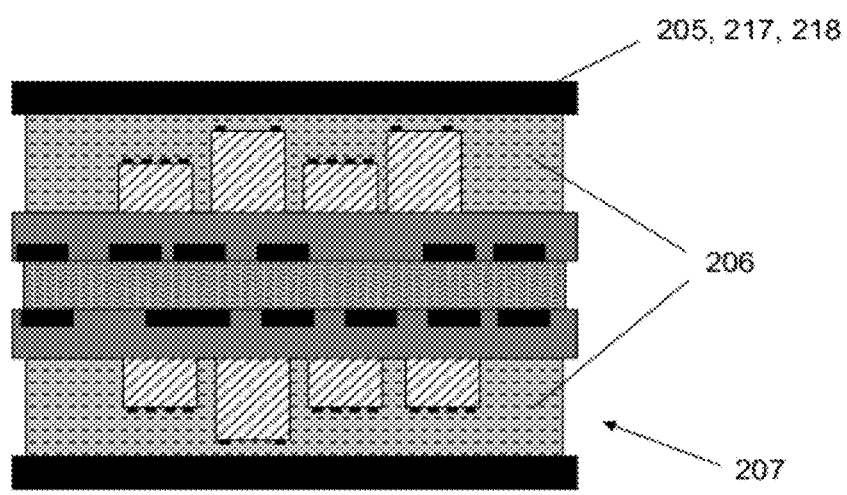

FIGS. 3C and 4F show the printed circuit board core 207 after method step d), i.e., after a further layer 205 or an electrically conductive layer 217 in the form of a copper foil 218 has been applied by lamination.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range.

LIST OF REFERENCE CHARACTERS

101 Components
102 Adhesive
103 Carrier
104 Liquid dielectric
105 Further conductive layer
106 Dielectric layer
107 Printed circuit board core
108 First electrically conductive layer
109 Metal foil
110 Surface
111 Edge surface
112 page
113 page
114 Contact
115 Thickness
116 Extension
117 Layer
118 Copper foil
119*a* Further layer
201 Components
202 Adhesive
203 Carrier
204 Liquid dielectric
205 Further conductive layer
206 Dielectric layer
207: Printed circuit board core
208 First electrically conductive layer
209 Metal foil
210 Surface
217 Electrically conductive layer
218 Copper foil
220 Separating layer
221 Front side
222 Back side

We claim:

1. A method for embedding at least one component into a dielectric layer, wherein the method comprises the steps of:
   a) positioning and affixing the at least one component on a carrier;
   b) casting a liquid dielectric around the at least one component, thereby completely enclosing the at least one component;
   c) hardening the liquid dielectric to form a solid dielectric layer; and
   d) applying another layer as an electrically conductive layer directly to the solid dielectric layer,
   wherein the carrier is formed of at least one first electrically conductive layer in the form of a metal foil.

2. The method according to claim 1, wherein the dielectric is formed with a minimum thickness of approximately 10 μm in the hardened state and a maximum thickness of approximately 1000 μm in the hardened state.

3. The method according to claim 1, wherein the dielectric is formed in the hardened state with a thickness of approximately 30-250 μm.

4. The method according to claim 1, wherein the liquid dielectric is formed of an element from the group consisting of: a thermoplastic material, a thermosetting plastic, and a polyimide.

5. The method according to claim 1, wherein the carrier is formed of at least one electrically conductive layer comprising a printed circuit board.

6. The method according to claim 1, wherein the metal foil is a copper foil.

7. The method according to claim 1, wherein at least one further dielectric adhesive layer ply is applied to the side of the first dielectric layer facing the electrically conductive layer.

8. The method according to claim 1, wherein step b) is performed using a method from the group comprising: screen printing, knife-coating, curtain coating, laminating processes, flexography, or engraving.

9. The method according to claim 1, wherein one component which comprises at least one electrical or thermal contact on at least one side is used.

10. The method according to claim 9, wherein the at least one component having at least one electrical or thermal contact is placed on the carrier.

11. The method according to claim 9, wherein components having an electrical or thermal contact are provided in combinations in one component layer.

12. The method according to claim 1, wherein the method comprises an initial process step, before step a), in which an adhesive is applied to the carrier on which the components are positioned and affixed, or in which an adhesive is applied to the components, and is used to bond the components to the carrier.

13. The method according to claim 1, wherein the at least one component is electrically or thermally connected to the conductive layers by way of plated holes between the conductive layers or conductive adhesive.

14. The method according to claim 1, wherein the at least one component is formed by an electrical component from the group comprising: ICs, IPDs, ASICs, power amplifiers, RFIDs, or flat passive components.

15. The method according to claim 1, wherein the liquid dielectric is formed of an element selected from the group consisting of: a thermoplastic material, a thermosetting plastic, and an epoxy resin.

16. The method according to claim 1, wherein the liquid dielectric is formed of an element selected from the group consisting of: a thermoplastic material, a thermosetting plastic, and a polyester resin.

17. The method according to claim 1, wherein the liquid dielectric is formed of an element selected from the group consisting of: a thermoplastic material, a thermosetting plastic, and a polyurethane.

18. The method according to claim 1, wherein the liquid dielectric is formed of an element selected from the group consisting of: a thermoplastic material, a thermosetting plastic, and an amino resin.

19. The method according to claim 1, wherein the further electrically conductive layer is formed of an element from the group consisting of: a thermoplastic polymer foil, and a metal-clad thermosetting plastic.

\* \* \* \* \*